United States Patent
Thei et al.

(10) Patent No.: US 10,050,033 B1
(45) Date of Patent: Aug. 14, 2018

(54) HIGH VOLTAGE INTEGRATION FOR HKMG TECHNOLOGY

(71) Applicant: Taiwan Semiconductor Manufacturing Co., Ltd., Hsin-Chu (TW)

(72) Inventors: Kong-Beng Thei, Pao-Shan Village (TW); Chien-Chih Chou, New Taipei (TW); Fu-Jier Fan, Hsinchu (TW); Hsiao-Chin Tuan, Judong County (TW); Yi-Huan Chen, Hsin Chu (TW); Alexander Kalnitsky, San Francisco, CA (US); Yi-Sheng Chen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/703,116

(22) Filed: Sep. 13, 2017

(51) Int. Cl.
| | | |
|---|---|---|
| *H01L 27/088* | (2006.01) | |
| *H01L 27/02* | (2006.01) | |
| *H01L 27/04* | (2006.01) | |
| *H01L 21/8238* | (2006.01) | |
| *H01L 27/092* | (2006.01) | |
| *H01L 29/51* | (2006.01) | |

(52) U.S. Cl.
CPC .... *H01L 27/088* (2013.01); *H01L 21/823828* (2013.01); *H01L 21/823857* (2013.01); *H01L 27/02* (2013.01); *H01L 27/0203* (2013.01); *H01L 27/04* (2013.01); *H01L 27/092* (2013.01); *H01L 29/517* (2013.01)

(58) Field of Classification Search
None
See application file for complete search history.

(56) References Cited

U.S. PATENT DOCUMENTS

| | | | | |
|---|---|---|---|---|
| 7,217,985 B2 * | 5/2007 | Kim | ................ | H01L 21/823418 257/391 |
| 2015/0069524 A1 * | 3/2015 | Hong | .................. | H01L 27/1203 257/392 |
| 2015/0262825 A1 * | 9/2015 | Chen | ............... | H01L 21/823462 438/587 |
| 2016/0027893 A1 * | 1/2016 | Kwon | ................... | H01L 29/513 257/411 |

* cited by examiner

*Primary Examiner* — Joseph Schoenholtz
(74) *Attorney, Agent, or Firm* — Eschweiler & Potashnik, LLC

(57) ABSTRACT

The present disclosure relates to an integrated circuit (IC) and a method of formation. In some embodiments, a first oxide component is disposed on a substrate within a medium voltage region. A first high-k dielectric component is disposed on the substrate within a low voltage region and a second high-k dielectric component disposed on the first oxide component within the medium voltage region. A first gate electrode separates from the substrate by the first high-k dielectric component. A second gate electrode separates from the substrate by the first oxide component and the second high-k dielectric component.

20 Claims, 8 Drawing Sheets

HIGH VOLTAGE INTEGRATION FOR HKMG TECHNOLOGY

BACKGROUND

The semiconductor integrated circuit (IC) industry has experienced exponential growth over the last few decades. In the course of IC evolution, high voltage technology has been widely used in power management, regulator, battery protector, DC motor, automotive relative, panel display driver (STN, TFT, OLED, etc.), color display driver, power supply relative, telecom, etc. On the other hand, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes. Semiconductor devices of the replacement gate technology which supports a logic core to accomplish an intended function are integrated on the same chip with the logic core. This integration reduces undesired communication loss between the semiconductor devices and the supported logic core. However, there are challenges to embed high voltage devices to replacement gate technology, also known as high-k metal gate (HKMG) technology, especially on 28 nm node and beyond process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
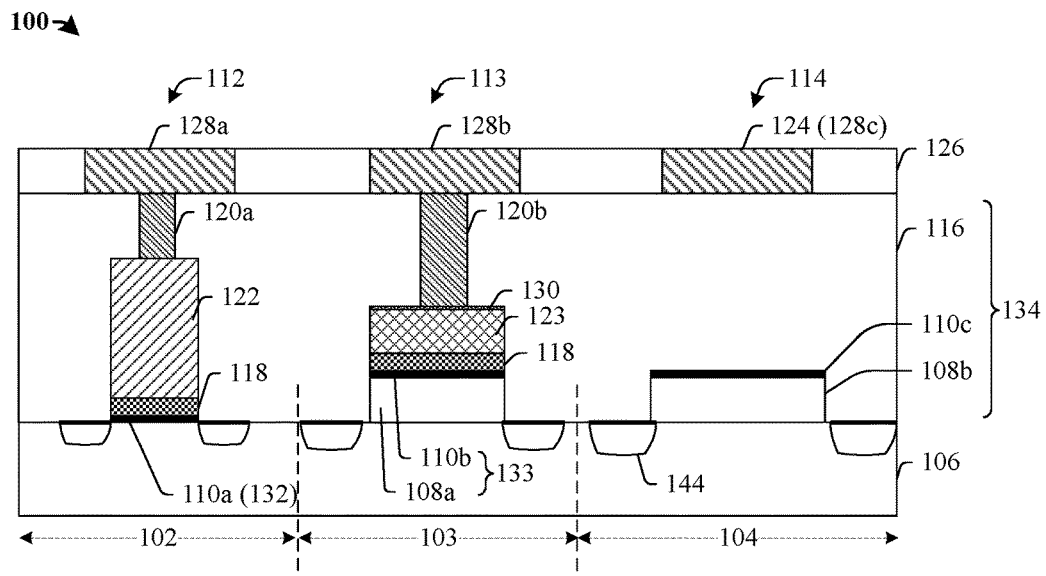
FIG. 1 illustrates a cross-sectional view of some embodiments of an integrated circuit (IC) comprising a low voltage region, a medium voltage region, and a high voltage region integrated in a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k metal gate (HKMG) technology has become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power. HKMG technology can be used for memory devices, display devices, sensor devices, among other applications where a high voltage region is incorporated in the integrated circuits to provide higher power and have higher breakdown voltage than conventional MOS devices. Factors associated with fabrication such integrated circuits may include integrating fabrication of devices with varies dimensions, such as different gate dielectric thicknesses, channel lengths, and/or channel widths of devices with different operating voltages. Also, since planarization processes are needed when fabricating the integrated circuits (planarizing metals, interlayer dielectrics for example), dishing effects (especially to the high voltage devices with large device area) may limit channel dimensions of the high voltage device.

The present disclosure relates to an integrated circuit (IC) that comprises a low voltage region, a medium voltage region, and a high voltage region integrated in a substrate, and a method of formation the integrated circuit. In some embodiments, referring to FIG. 1 for example, an integrated circuit 100 comprises a low voltage region 102, a medium voltage region 103, and a high voltage region 104 respectively having a first transistor gate stack 112, a second transistor gate stack 113, and a third transistor gate stack 114. In some embodiments, a first gate electrode 122 in the low voltage region 102 may be a metal gate formed by a metal gate replacement process, and a first gate dielectric 132 may comprise a high-k dielectric layer. A second gate electrode 123 in the medium voltage region 103 may comprise polysilicon. A second gate dielectric 133 may be thicker than the first gate dielectric 132 and comprise a high-k dielectric layer and an additional oxide layer. Further, a third metal line 128c of a metal layer of an interconnect structure may be used as a third gate electrode 124 within the high voltage region. A corresponding third gate dielectric 134 may comprise a high-k dielectric layer 110c, an oxide component 108b, and an interlayer dielectric layer 116. By applying fabrication processes disclosed below with replacement gate technology, forming varies gate electrodes (e.g. the first gate electrode 122 of metal, the second gate electrode 123 of polysilicon, and/or the third gate electrode 124 of a metal line of an interconnect structure), and forming varies gate dielectrics (e.g. the first gate dielectric 132, the second gate dielectric 133, and/or the third gate dielectric 134) having different heights and compositions, device performance is improved and manufacturing process is simplified, such that further scaling becomes possible in emerging technology nodes.

As shown in FIG. 1, an integrated circuit 100 is disposed over a substrate 106 and includes a low voltage region 102, a medium voltage region 103, and a high voltage region 104. A first transistor gate stack 112 is disposed within the low voltage region 102. The first transistor gate stack 112 is configured to operate at a first operation voltage. Example first operation voltages can be 1V, 1.5V, or 2.5V or other voltages smaller than around 3V. The first transistor gate stack 112 comprises a first gate electrode 122, and a first gate dielectric 132 separating the first gate electrode 122 from the substrate 106. A barrier layer 118 may be disposed between the first gate electrode 122 and a first high-k dielectric component 110a. The barrier layer 118 may comprise metal or metal alloy material such as Ti or TiN. In some embodiments, the first gate electrode 122 may be made of metal or metal alloy material. The first gate dielectric 132 comprises a first high-k dielectric component 110a. The first high-k dielectric component 110a may contact an upper surface of the substrate 106. The first gate electrode 122 may be coupled to a first metal line 128a through a first contacting via 120a.

A second transistor gate stack 113 is disposed within the medium voltage region 103. The second transistor gate stack 113 is configured to operate at a second operation voltage greater than the first operation voltage of the first transistor gate stack 112. Example second operation voltages can be 6V, 8V, 12V or other voltages greater than around 3V but smaller than around 20V. The second transistor gate stack 113 comprises a second gate electrode 123 and a second gate dielectric 133 separating the second gate electrode 123 from the substrate 106. In some embodiments, the second gate electrode 123 may be made of polysilicon material. The second gate dielectric 133 comprises a second high-k dielectric component 110b and a first oxide component 108a. The first oxide component 108a may contact the upper surfaces of the substrate 106. With the first oxide component 108a in place, the second gate dielectric 133 can have a thickness greater than that of the first gate dielectric 132. Such that the breakdown voltage of the second transistor gate stack 113 is greater than the first transistor gate stack. In some embodiments, the thickness of the second gate dielectric 133 is about 2 to 10 times of a thickness of the first gate dielectric 132. For example, the first gate dielectric 132 can have a thickness in a range of from about 30 angstroms (Å) to about 100 ∈, while the second gate dielectric 133 can have a thickness in a range of from about 150 ∈ to about 400 ∈. As can be appreciated, theses dimensions and other dimensions discussed herein can be scaled for different process nodes. In some embodiments, the first oxide component 108a may contact an upper surface of the substrate 106. The second high-k dielectric component 110b may be disposed directly onto the first oxide component 108a. The barrier layer 118 may be disposed between the second gate electrode 123 and the second high-k dielectric component 110b. In some embodiments, a silicide layer 130 may be disposed on a top surface of the second gate electrode 123. The second gate electrode 123 may be coupled to a second metal line 128b through a second contacting via 120b. In some embodiments, the first contacting via 120a and the second contacting via 120b are surrounded by a first interlayer dielectric layer 116. The first interlayer dielectric layer 116 extends across the low voltage region 102 and the medium voltage region 103 over the first gate electrode 122 and the second gate electrode 123. In some embodiments, the first interlayer dielectric layer 116 may comprise a low-k dielectric layer, an ultra-low-k dielectric layer, an extreme low-k dielectric layer, and/or a silicon dioxide layer. A top surface of the first gate electrode 122 is positioned higher relative to an upper surface of the substrate 106 than a top surface of the second gate electrode 123. The first gate electrode 122 has a first thickness greater than a second thickness of the second gate electrode 123. The first contacting via 120a has a vertical height greater than that of the second contacting via 120b. The first metal line 128a and the second metal line 128b are located within a first metal layer (for example, metal layer M1 of an interconnect structure) and surrounded by a second interlayer dielectric layer 126.

A third transistor gate stack 114 disposed within the high voltage region 104. The third transistor gate stack 114 is configured to operate at a third operation voltage greater than the second operation voltage of the second transistor gate stack 113. Example third operation voltage can be 25V, 32V or even higher voltages. The third transistor gate stack 114 comprises a third gate electrode 124 and a third gate dielectric 134 that separates the third gate electrode 124 from the substrate 106. The third gate dielectric 134 comprises a second oxide component108b, a third high-k dielectric component 110c, and the first interlayer dielectric layer 116. The second oxide component 108b may contact the upper surfaces of the substrate 106. With the first interlayer dielectric layer 116 functioned as a part of the third gate dielectric 134, the third gate dielectric 134 can have a thickness greater than that of the second gate dielectric layer 133. Such that the breakdown voltage of the third transistor gate stack 114 is further increased. In some embodiments, the thickness of the third gate dielectric 134 is about 5 to 10 times of a thickness of the second gate dielectric 133. For example, the second gate dielectric 133 can have a thickness in a range of from about 150 angstroms (Å) to about 300 Å, while the third gate dielectric 133 can have a thickness in a range of from about 1000 Å to about 1500 Å. In some embodiments, a third metal line 128c can be used as the third gate electrode 124. The third metal line 128c may also be disposed within the first metal layer of the first metal line 128a and the second metal line 128b.

As will be described in details below, in some embodiments, the first, second and third high-k dielectric components 110a, 110b, 110c may be made from a same type of high-k dielectric layer (e.g. the second gate dielectric layer 502 shown in FIG. 5), such that the first, second and third high-k dielectric components 110a, 110b, 110c have substantially the same composition and thickness. The first and second oxide components 108a, 108b may be made from a same oxide layer (e.g. the first gate dielectric layer 302 shown in FIG. 3), such that the first and second oxide components 108a, 108b have substantially the same composition and thickness. The oxide layer may be formed directly on the upper surface of the substrate 106 and the first and second oxide components 108a, 108b have top surfaces substantially aligned.

Figure 2:
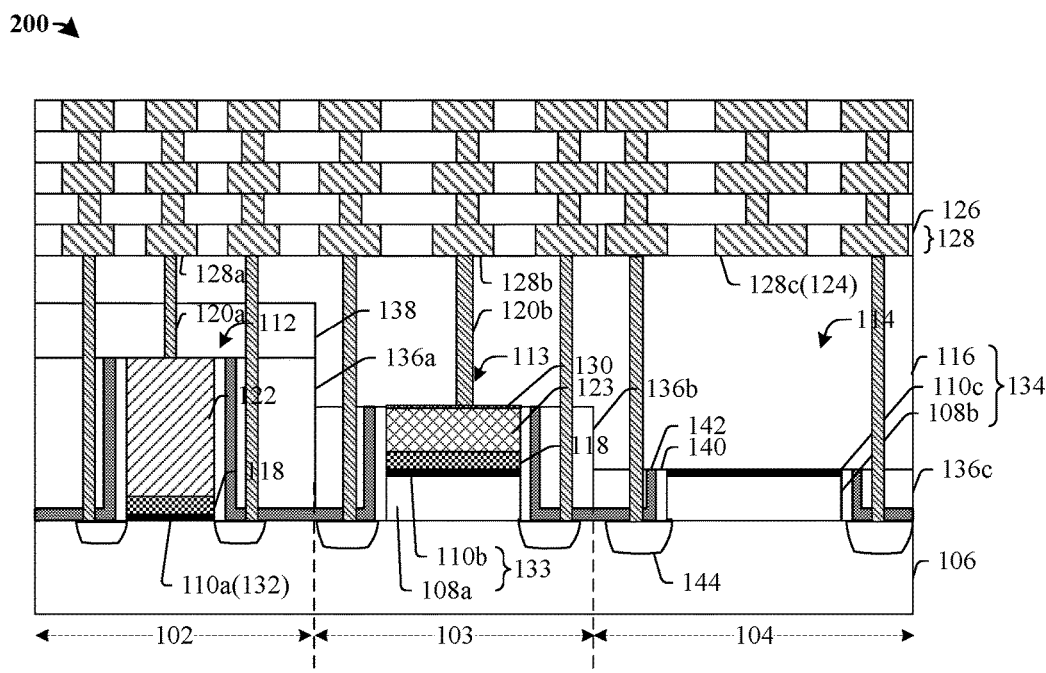
FIG. 2 illustrates a cross-sectional view of some additional embodiments of an IC comprising a low voltage region, a medium voltage region, and a high voltage region integrated in a substrate.

FIG. 2 illustrates a cross-sectional view of some additional embodiments of an integrated circuit comprising a low voltage region, a medium voltage region, and a high voltage region integrated in a substrate. As shown in FIG. 2, an integrated circuit 200 is disposed over a substrate 106 and includes a low voltage region 102, a medium voltage region 103, and a high voltage region 104. A first oxide component 108a is disposed on the substrate 106 within the medium voltage region 103, and a second oxide component 108b is disposed on the substrate 106 within the high voltage region 104. A first high-k dielectric component 110a is disposed on the substrate 106 within the low voltage region 102, and a second high-k dielectric component 110b is disposed on the first oxide component 108a within the medium voltage region 103, and a third high-k dielectric component 110c is disposed on the second oxide component 108b within the high voltage region 104. A first gate electrode 122 is disposed within the low voltage region 102, separate from the substrate 106 by the first high-k dielectric component 110a. A second gate electrode 123 is disposed within the medium voltage region 103, separating from the substrate 106 by the first oxide component 108a and the second high-k dielectric component 110b. A first interlayer dielectric layer 116 is disposed over the first gate electrode 122 and the second gate electrode 123 and the third high-k dielectric component 110c extending across the low voltage region 102, the medium voltage region 103, and the high voltage region 104. A first metal layer 128 is disposed over the first interlayer dielectric layer 116 and surrounded by a second interlayer dielectric layer 126. The first metal layer 128 comprises a first metal line 128a electrically coupled to the first gate electrode 122, a second metal line 128b electrically coupled to the second gate electrode 123, and a third metal line 128c disposed overlying the third high-k dielectric component 110c. The third metal line 128c is configured as a third gate electrode 124 separating from the substrate 106 by the second oxide component 108b, the third high-k dielectric component 110c, and the first interlayer dielectric layer 116. A first vertical distance from a top surface of the first gate electrode 122 to an upper surface of the substrate 106 is greater than a second vertical distance from a top surface of the second gate electrode 123 to the upper surface of the substrate 106, such that a first contacting via 120a that couples the first gate electrode 122 and the first metal line 128a has a vertical height greater than that of a second contacting via 120b that couples the second gate electrode 123 and the second metal line 128b.

Thus, the low voltage region 102 comprises a first transistor gate stack 112 configured to operate at a first operation voltage and having the first gate electrode 122 disposed over a first gate dielectric layer 132. The first gate dielectric 132 comprises the first high-k dielectric component 110a. The first transistor gate stack 112 can be part of an NMOS transistor or a PMOS transistor, or a fin-type field effect transistor (FinFET). The first gate electrode 122 can be a metal gate electrode having different metal compositions for NMOS transistor and PMOS transistor. By making use of HKMG structure in transistors of the low voltage region 102, transistor capacitance (and thereby drive current) is increased and gate leakage and threshold voltage are reduced. In some embodiments, the first gate electrode 122 comprises a core metal layer separated from the first high-k dielectric component 110a by a barrier layer 118. The barrier layer 118 protects the core metal layer from diffusing into surrounding materials. In some embodiments, the core metal layer comprises copper (Cu), tungsten (W) or aluminum (Al), or their alloys, for example; and the barrier layer can comprise metal materials such as titanium (Ti), tantalum (Ta), zirconium (Zr), or their alloys, for example. In some embodiments, the first high-k dielectric component 110a comprises hafnium oxide (HfO), hafnium silicon oxide (HfSiO), hafnium aluminum oxide (HfAlO), or hafnium tantalum oxide (HMO), for example. Though not shown in FIG. 2, in some embodiments, the low voltage region 102 may comprise memory devices. The medium voltage region 103 comprises a second transistor gate stack 113 configured to operate at a second operation voltage greater than the first operation voltage of the first transistor gate stack 112. The second transistor gate stack 113 comprises the second gate electrode 123 and a second gate dielectric 133 separating the second gate electrode 123 from the substrate 106. The second gate electrode 123 may be made of polysilicon material. The second gate dielectric 133 comprises the second high-k dielectric component 110b and the first oxide component 108a. The high voltage region 104 comprises a third transistor gate stack 114 configured to operate at a third operation voltage greater than the second operation voltage of the second transistor gate stack 113. The third transistor gate stack 114 can be a driver transistor, a power transistor, among applications. The third transistor gate stack 114 can be an LDMOS (laterally diffused metal oxide semiconductor) transistor designed for high blocking voltage. The third transistor gate stack 114 comprises the third gate electrode 124 and a third gate dielectric 134 separating the third gate electrode 124 from the substrate 106. The third gate dielectric 134 comprises the second oxide component108b, the third high-k dielectric component 110c, and the first interlayer dielectric layer 116. The first gate electrode 122, the second gate electrode 123, and the third gate electrode 124 are respectively disposed between source/drain regions 144. The source/drain regions 144 may be asymmetrical. Isolation regions (such as a shallow trench isolation (STI) structure or a deep trench isolation (DTI) structure) are not shown but can be disposed under and aside from the gate electrodes within the substrate 106. The third gate electrode 124 and the second gate electrode 123 may have a gate length and a gate width greater than that of the first gate electrode 122. Notably, for simplification reason, some features described in FIG. 1 are not repeatedly described for FIG. 2 but could be incorporated and applied to FIG. 2. For example, the first, second and third high-k dielectric components 110a, 110b, 110c in FIG. 2 may also be made from one high-k dielectric layer (e.g. the second gate dielectric layer 502 shown in FIG. 5). The first and second oxide components 108a, 108b in FIG. 2 may also be made from a same oxide layer (e.g. the first gate dielectric layer 302 shown in FIG. 3).

In some embodiments, a sidewall spacer 140 can be disposed along sidewalls of the first gate electrodes 122 and the first gate dielectric 132 within the low voltage region 102, the second gate electrode 123 and the second gate dielectric 133 within the medium voltage region 103, and the second oxide component108b and the third high-k dielectric component 110c within the high voltage region 104. In some embodiments, the sidewall spacer 140 may comprise one or more layers of oxide or nitride. A third interlayer dielectric layer 136 comprises portions 136a, 136b, 136c respectively surrounds the sidewall spacer 140 within the low voltage region 102, the medium voltage region 103, and the high voltage region 104. A contact etch stop layer 142 may separate the third interlayer dielectric layer 136 from the sidewall spacer 140. The contact etch stop layer 142 may comprise a planar lateral component connecting a first vertical component abutting the sidewall spacer 140 arranged along a side of the structures within the medium voltage region 103 and a second vertical component abutting the sidewall spacer 140 arranged along a side of the structures within the low voltage region 102 or the high voltage region 104. Using the third interlayer dielectric layer 136 and the contact etch stop layer 142 to isolate the devices and structures allows for high device density to be achieved. In some embodiments, a hard mask 138 can be disposed on the first gate electrode 122 and contact top surfaces of the sidewall spacer 140 and the contact etch stop layer 142. The third interlayer dielectric layer 136 may comprise an upper surface aligned with those of the sidewall spacer 140 and/or the contact etch stop layer 142. One or more of the plurality of contacts may extend through the first interlayer dielectric layer 116, the third interlayer dielectric layer 136 and the hard mask 138 within the low voltage region and be coupled to the source/drain regions 144. In some embodiments, the plurality of contacts may comprise a metal such as tungsten, copper, and/or aluminum.

FIGS. 3-15 illustrate a series of cross-sectional views 300-1500 of some embodiments of a method for manufacturing an IC comprising a low voltage region, a medium voltage region, and a high voltage region integrated in a substrate.

Figure 3:
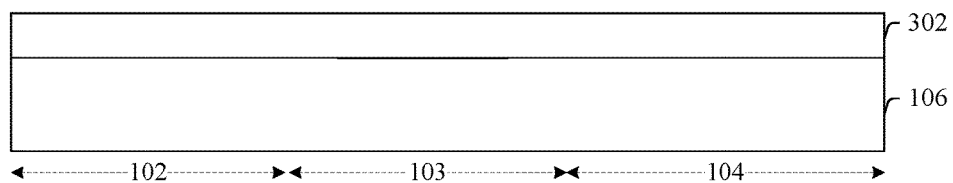
FIGS. 3-15 illustrate a series of cross-sectional views of some embodiments of a method for manufacturing an IC comprising a low voltage region, a medium voltage region, and a high voltage region integrated in a substrate.

As shown in cross-sectional view 300 of FIG. 3, a substrate 106 having a low voltage region 102, a medium voltage region 103, and a high voltage region 104 defined thereon is provided. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. A first gate dielectric layer 302 is formed on the substrate 106. The first gate dielectric layer 302 can be an oxide layer, such as a silicon dioxide layer, but other suitable gate dielectric material is also applicable. The first gate dielectric layer 302 may be formed by a thermal process, for example, by forming a silicon dioxide layer on a silicon substrate at high temperatures from 800° C.-1100° C. using a dry thermal growth method. The thickness of the first gate dielectric layer 302 depends on applications, ranging from about several or tens of nanometers (nm) for current nodes to several angstroms (Å) for emerging nodes.

Figure 4:
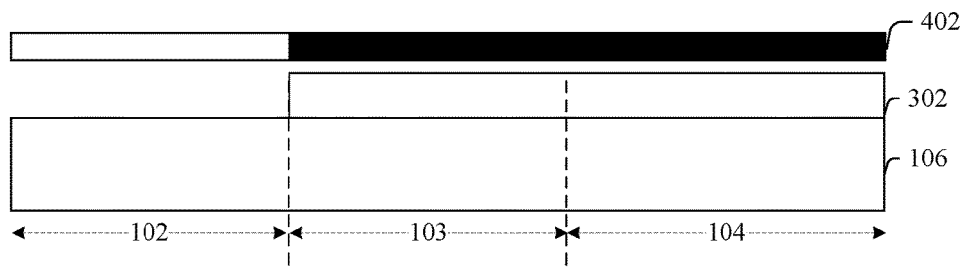

As shown in cross-sectional view 400 of FIG. 4, the first gate dielectric layer 302 is patterned and selectively removed from the low voltage region 102 (while being kept within the medium voltage region 103 and the high voltage region 104). A lithography process is performed having a photomask 402 applied to pattern a photoresist layer (not shown in the figure) over the first gate dielectric layer 302 of FIG. 3. The photoresist layer comprises openings corresponding to the low voltage region 102 to expose the first gate dielectric layer 302 within the low voltage region 102 and to protect the first gate dielectric layer 302 within the medium voltage region 103 and the high voltage region 104 from a series of etching processes. In various embodiments, the etching processes may comprise a wet etch or a dry etch (e.g., a plasma etch with tetrafluoromethane (CF4), sulfur hexafluoride (SF6), nitrogen trifluoride (NF3), etc.). The mask layer 402 will be substantially removed after the etching processes.

Figure 5:
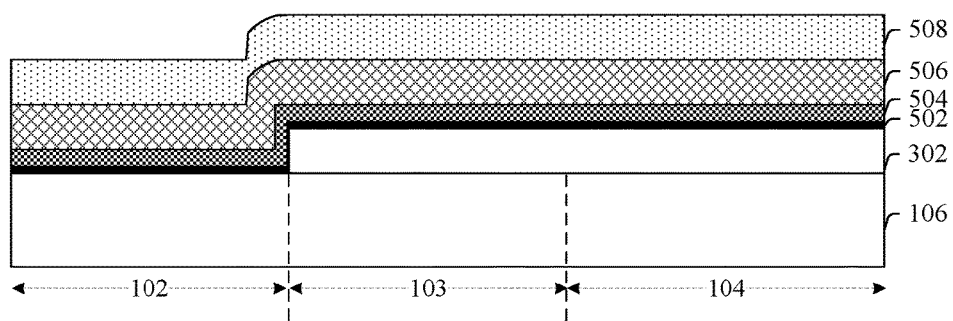

As shown in cross-sectional view 500 of FIG. 5, a second gate dielectric layer 502 is formed on the substrate 106 within the low voltage region 102, and on the first gate dielectric layer 302 within the medium voltage region 103 and the high voltage region 104. A barrier layer 504, a first polysilicon layer 506, and a hard mask layer 508 are subsequently formed over the second gate dielectric layer 502. In some embodiments, the second gate dielectric layer may comprise a high-k dielectric layer having a dielectric constant greater than that of silicon dioxide, such as hafnium oxide (HfO), hafnium silicon oxide (HfSiO), hafnium aluminum oxide (HfAlO), or hafnium tantalum oxide (HMO), for example. The barrier layer 504 may comprise metal or metal alloy material such as Ti or TiN. The hard mask layer 508 may comprise silicon dioxide and/or silicon nitride. In some embodiments, the second gate dielectric layer 502, the barrier layer 504, the first polysilicon layer 506, and the hard mask layer 508 can be formed by using a deposition technique (e.g., PVD, CVD, PE-CVD, ALD, etc.).

Figure 6:
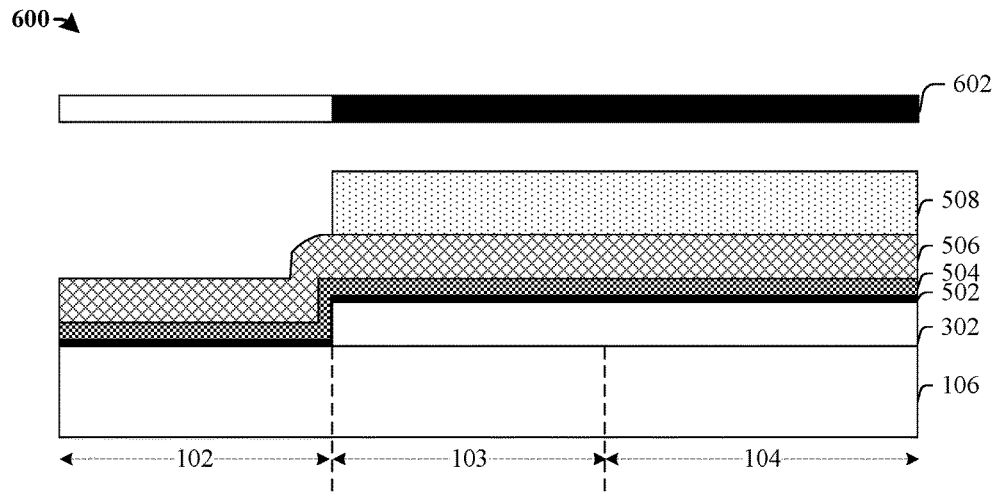

As shown in cross-sectional view 600 of FIG. 6, the hard mask layer 508 is patterned to be removed from the low voltage region 102 to expose an upper surface of the first polysilicon layer 506 within the low voltage region 102, and to be kept within the medium voltage region 103 and the high voltage region 104. Similar to the patterning process described above, lithography process is performed having a photomask 602 applied to pattern a photoresist layer (not shown in the figure) having openings corresponding to the low voltage region 102 to expose the first polysilicon layer 506 within the low voltage region 102 and to protect the hard mask layer 508 within the medium voltage region 103 and the high voltage region 104 from a series of etching processes.

Figure 7:
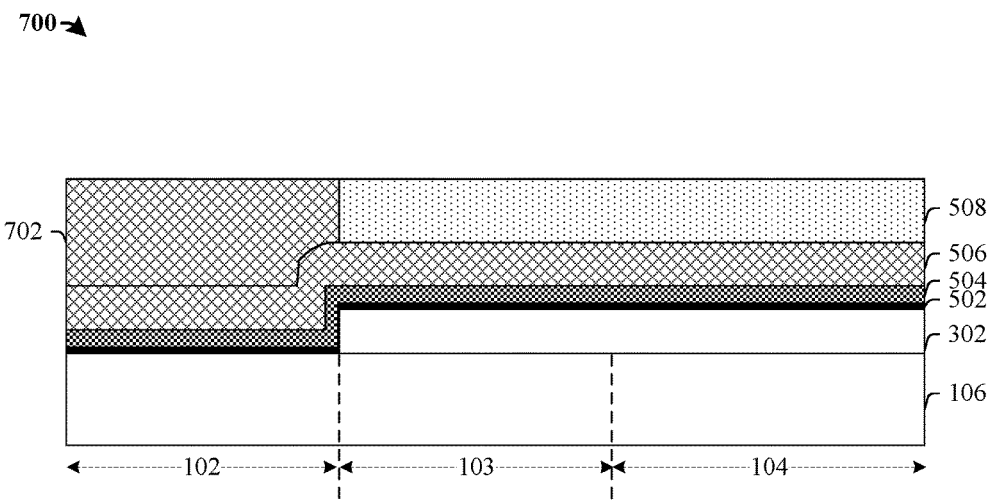

As shown in cross-sectional view 700 of FIG. 7, a second polysilicon layer 702 is formed on the first polysilicon layer 506 within the low voltage region 102 and on the hard mask layer 508 within the medium voltage region 103 and the high voltage region 104. Then the second polysilicon layer 702 is then removed from the medium voltage region 103 and the high voltage region 104 (e.g., by a planarization process). In some embodiments, the second polysilicon layer 702 is formed by using a deposition technique (e.g., PVD, CVD, PE-CVD, ALD, etc.). As a processing result, the second polysilicon layer 702 can have a top surface aligned with a top surface of the hard mask layer 508.

Figure 8:
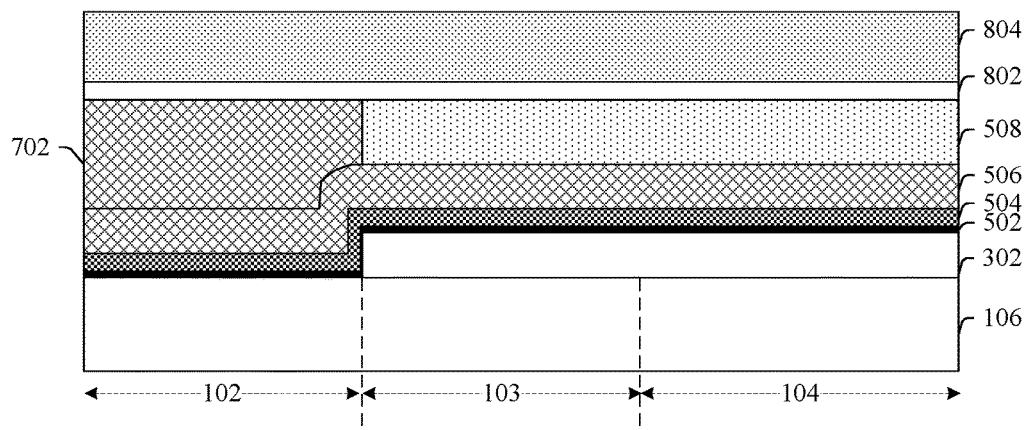

As shown in cross-sectional view 800 of FIG. 8, a first dielectric layer 802 and a second dielectric layer 804 are formed over the second polysilicon layer 702 and the hard mask layer 508. The first dielectric layer 802 and the second dielectric layer 804 are then patterned (not shown in the figure) and collectively function as a hard mask for the subsequent gate stack patterning processes. In some embodiments, the first dielectric layer 802 may comprise silicon dioxide and the second dielectric layer 804 may comprise silicon nitride. The first dielectric layer 802 is thinner than the second dielectric layer 804. For example, the first dielectric layer 802 can be ⅟₁₀ of the collective thickness of the first dielectric layer 802 and the second dielectric layer 804.

Figure 9:
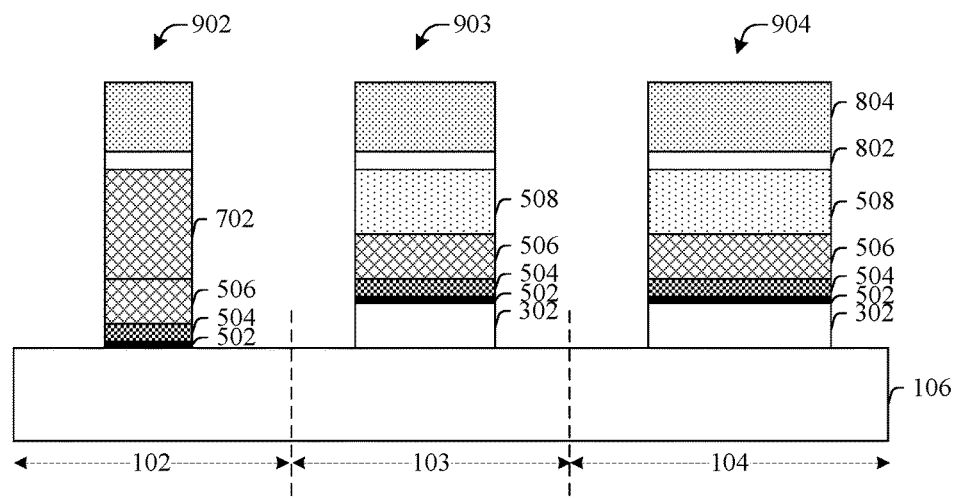

As shown in cross-sectional view 900 of FIG. 9, according to the patterned second dielectric layer 804 and first dielectric layer 802, the second polysilicon layer 702, the hard mask layer 508, the first polysilicon layer 506, the barrier layer 504, the second gate dielectric layer 502, and the first gate dielectric layer 302 are patterned and etched to form a first gate stack 902 within the low voltage region 102, a second gate stack 903 within the medium voltage region 103, and a third gate stack 904 within the high voltage region 104. As an example, the first gate stack 902 may comprise portions of the second polysilicon layer 702, the first polysilicon layer 506, the barrier layer 504 and the second gate dielectric layer 502. The second gate stack 903 may comprise portions of the hard mask layer 508, the first polysilicon layer 506, the barrier layer 504, the second gate dielectric layer 502, and the first gate dielectric layer 302. The third gate stack 904 may comprise the same composite as the second gate stack 903. Outer sidewalls of the corresponding portions the first gate stack 902, the second gate stack 903, and the third gate stack 904 can be respectively aligned one another.

Figure 10:
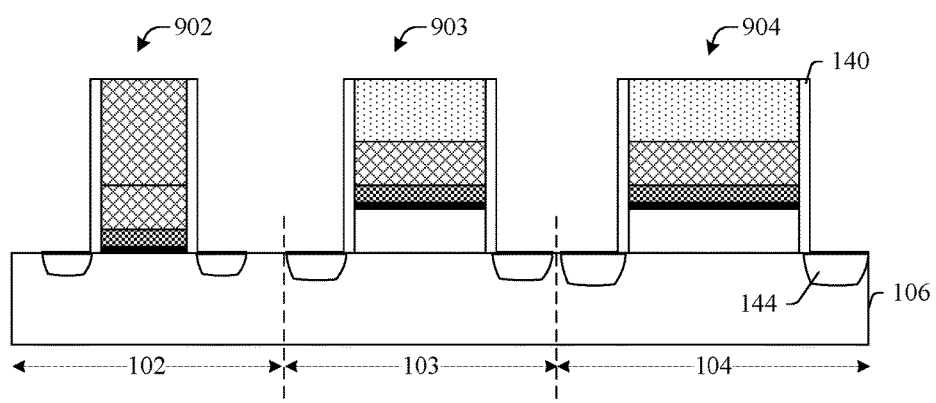

As shown in cross-sectional view 1000 of FIG. 10, a sidewall spacer 140 can be formed along sidewalls of the first gate stack 902, the second gate stack 903, and the third gate stack 904. The sidewall spacer 140 may comprise one or more layers of oxide or nitride. Source/drain regions 144 are formed between opposing sides of the first gate stack 902, the second gate stack 903, and the third gate stack 904 within the substrate 106. In some embodiments, the source/drain regions 144 may be formed by an implantation process that selectively implants the substrate 106 with a dopant, such as boron (B) or phosphorous (P), for example. In some other embodiments, the source/drain regions may be formed by performing an etch process to form a trench followed by an epitaxial growth process. In such embodiments, the source/drain regions 144 may have a raised portion that is higher than the upper surface of the substrate 106. In some embodiments, a salicidation process is performed to form a silicide layer (not shown in the figure) on upper surfaces of the source/drain regions 144. In some embodiments, the salicidation process may be performed by depositing a nickel layer and then performing a thermal annealing process (e.g., a rapid thermal anneal).

Figure 11:
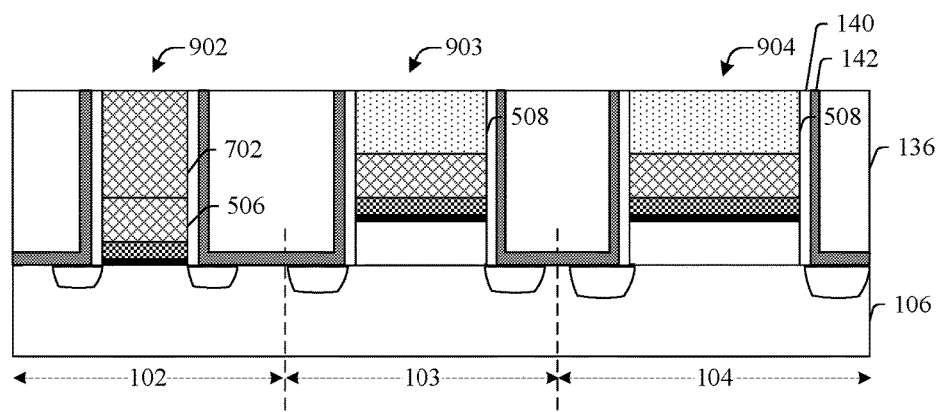

As shown in cross-sectional view 1100 of FIG. 11, a contact etch stop layer 142 may be then subsequently formed lining sidewalls of the sidewall spacer 140. The contact etch stop layer may comprise silicon nitride formed by way of a deposition process (e.g., CVD, PVD, etc.). A third interlayer dielectric layer 136 is then formed between and over the contact etch stop layer 142. The contact etch stop layer 142 and the third interlayer dielectric layer 136 may be formed by way of deposition processes (e.g., CVD, PVD, etc.). After the deposition processes, the contact etch stop layer 142 and the third interlayer dielectric layer 136 are subject to etching processes (including but not limiting to a planarization process), so as to be removed from the top of the first gate stack 902, the second gate stack 903, and the third gate stack 904, such that top surfaces of the second polysilicon layer 702 and the hard mask layer 508 are exposed and aligned with those of the sidewall spacer 140, the contact etch stop layer 142, and/or the third interlayer dielectric layer 136.

Figure 12:
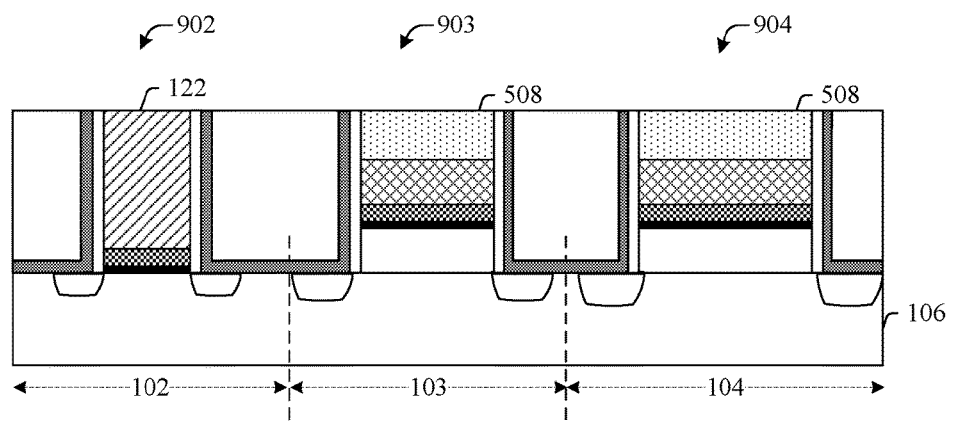

As shown in cross-sectional view 1200 of FIG. 12, the second polysilicon layer 702 and the first polysilicon layer 506 within the low voltage region 102 is removed, resulting in the formation of trenches between the sidewall spacers 140. Metal gate materials are then filled into the trenches to form a first gate electrode 122. The first gate electrode 122 is formed through one or more deposition processes (e.g., chemical vapor deposition, physical vapor deposition, etc.). The first gate electrode 122 may comprise core metal materials such as titanium (Ti), tantalum (Ta), zirconium (Zr), or their alloys, for example. A series of deposition and etching processes can be performed that form different metal compositions within the trenches for different devices or different components of the same devices, to achieve desired work functions.

Figure 13:
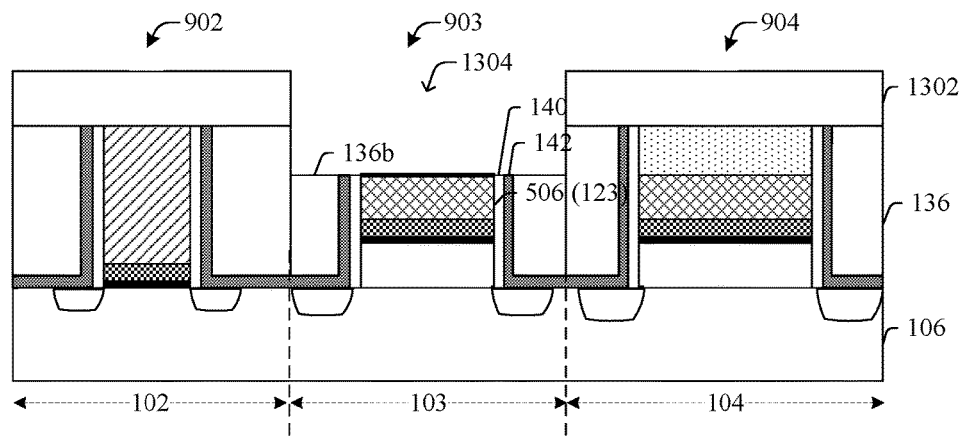

As shown in cross-sectional view 1300 of FIG. 13, a hard mask layer 1302 is formed over the first gate stack 902, the second gate stack 903, the third gate stack 904, and the third interlayer dielectric layer 136. The hard mask layer 1302 is then patterned to leave an opening 1304 at the medium voltage region 103 and to expose the first polysilicon layer 506. A second portion 136*b* of the third interlayer dielectric layer 136 is also etched such that a top surface is aligned with the first polysilicon layer 506, and/or the sidewall spacer 140 and the contact etch stop layer 142 within the medium voltage region 103. In some embodiments, a salicidation process is performed to form a silicide layer on upper surfaces of the first polysilicon layer 506. In some other embodiments, the first polysilicon layer 506 is fully silicide to achieve sufficient conductivity. As a result, a second gate electrode 123 is formed.

Figure 14:
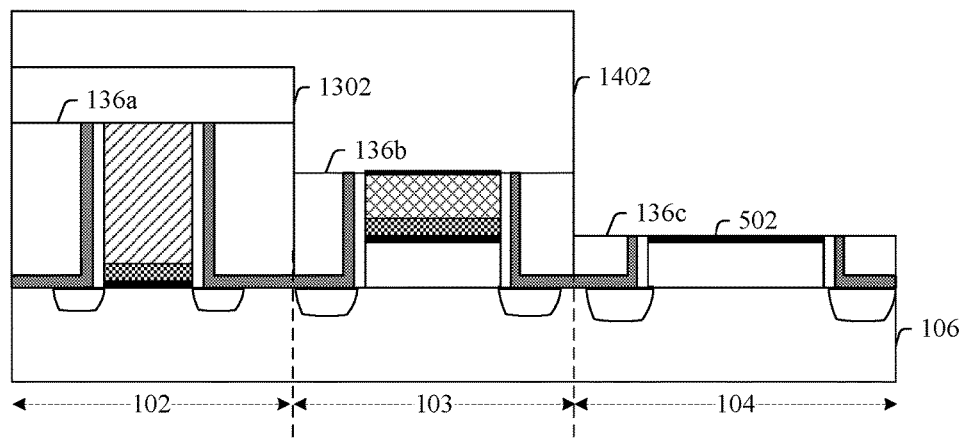

As shown in cross-sectional view 1400 of FIG. 14, a portion of the hard mask layer 1302 within the high voltage region 104 (shown in FIG. 13) is removed. A masking layer 1402 is formed and patterned to cover the low voltage region 102 and the medium voltage region 103. The high voltage region 104 is exposed and subsequently etched to form a third portion 136*c* of the third interlayer dielectric layer 136 having a top surface aligned with the second gate dielectric layer 502, and/or the sidewall spacer 140 and the contact etch stop layer 142 within the high voltage region 104.

Figure 15:
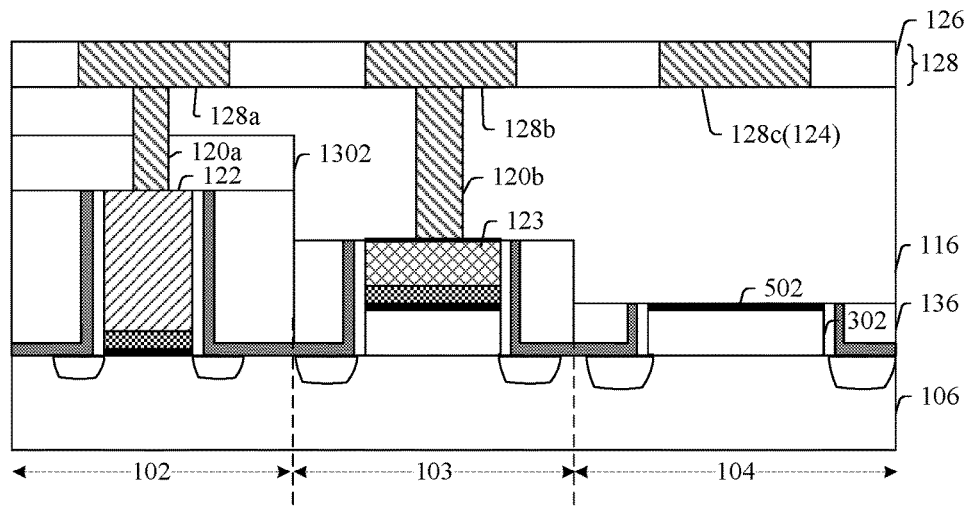

As shown in cross-sectional view 1500 of FIG. 15, a first interlayer dielectric layer 116 is formed over the first gate electrode 122 and the second gate electrode 123 and the second gate dielectric layer 502 extending across the low voltage region 102, the medium voltage region 103, and the high voltage region 104. A first metal layer 128 is disposed over the first interlayer dielectric layer 116 and surrounded by a second interlayer dielectric layer 126. The first metal layer 128 comprises a first metal line 128*a* electrically coupled to the first gate electrode 122, a second metal line 128*b* electrically coupled to the second gate electrode 123, and a third metal line 128*c* disposed overlying the second gate dielectric layer 502. The third metal line 128*c* is configured as a third gate electrode 124 separating from the substrate 106 by the first gate dielectric layer 302, the second gate dielectric layer 502, and the first interlayer dielectric layer 116. A first contacting via 120*a* is formed to couple the first gate electrode 122 and the first metal line 128*a*. A second contacting via 120*b* is formed to couple the second gate electrode 123 and the second metal line 128*b*. Other contacts or contacting vias can also be formed through the first interlayer dielectric layer 116 and/or the third interlayer dielectric layer 136. The contacts may be formed by selectively etching the interlayer dielectric layers to form openings (e.g. with a patterned photoresist mask in place), and by subsequently depositing a conductive material within the openings. In some embodiments, the conductive material may comprise tungsten (W) or titanium nitride (TiN), for example.

Figure 16:
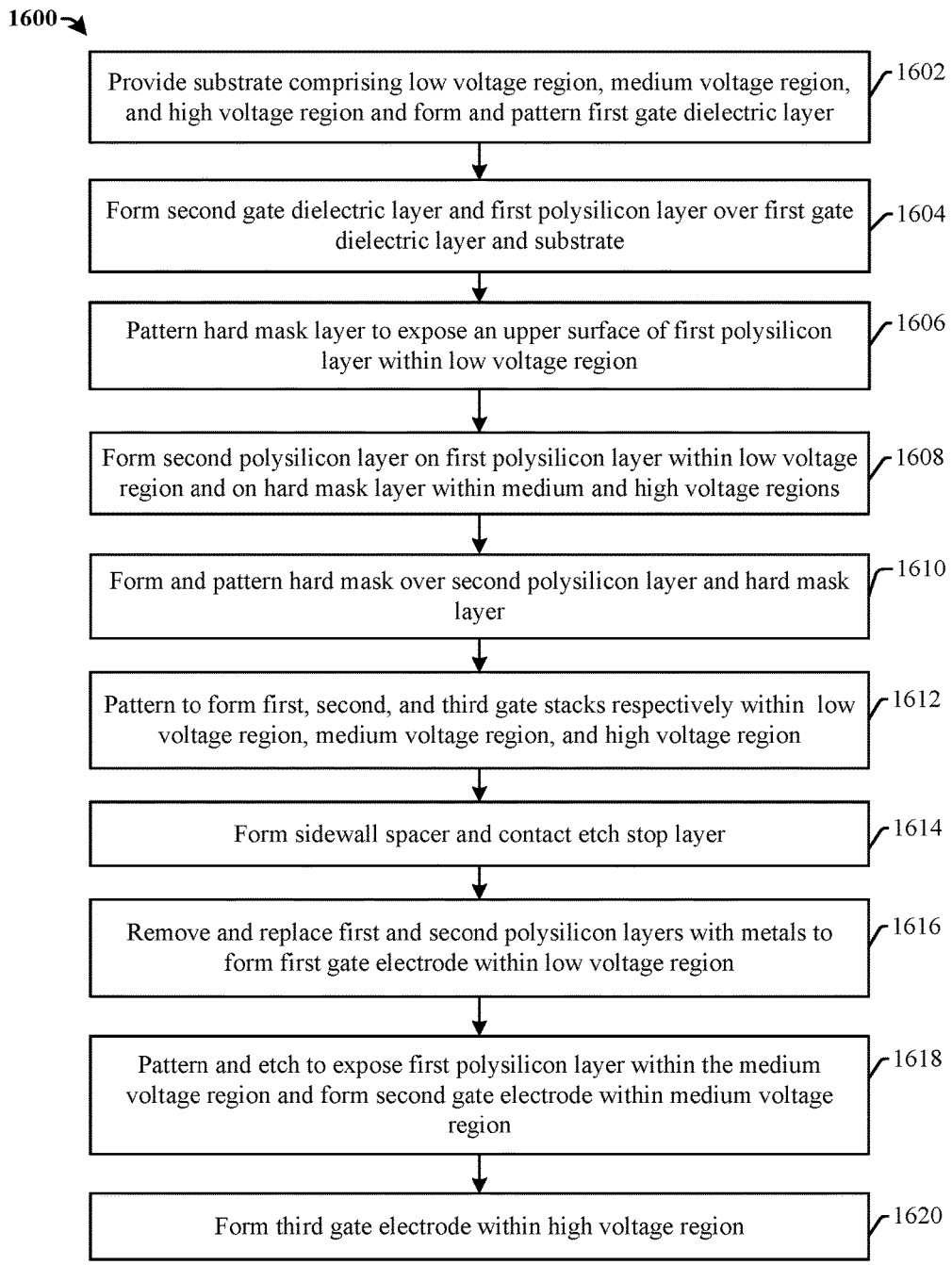
FIG. 16 illustrates a flow diagram of some embodiments of a method for manufacturing an IC comprising a low voltage region, a medium voltage region, and a high voltage region integrated in a substrate.

FIG. 16 illustrates a flow diagram of some embodiments of a method 1600 for manufacturing an IC comprising a low voltage region, a medium voltage region, and a high voltage region integrated in a substrate.

Although method 1600 is described in relation to FIGS. 3-15, it will be appreciated that the method 1600 is not limited to such structures, but instead may stand alone as a method independent of the structures. Furthermore, while the disclosed methods (e.g., method 1600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a substrate is provided including a low voltage region, a medium voltage region, and a high voltage region. A dielectric layer is formed on the substrate. The dielectric layer is then patterned to be removed from the low voltage region and be kept within the medium voltage region and the high voltage region to form a first gate dielectric layer. FIGS. 3-4 illustrate some embodiments of cross-sectional views 300, 400 corresponding to act 1602.

At 1604, a second gate dielectric layer and a first polysilicon layer are subsequently formed. The second gate dielectric layer may be a high-k dielectric layer. A barrier layer and a hard mask layer may also be formed. The second gate dielectric layer and the first polysilicon layer may be formed by deposition. FIG. 5 illustrates some embodiments of a cross-sectional view 500 corresponding to act 1604.

At 1606, the hard mask layer is patterned to be removed from the low voltage region to expose an upper surface of the first polysilicon layer, and to be kept within the medium voltage region and the high voltage region. FIG. 6 illustrates some embodiments of a cross-sectional view 600 corresponding to act 1606.

At 1608, a second polysilicon layer is formed on the first polysilicon layer within the low voltage region and on the hard mask layer within the medium voltage region and the high voltage region. The second polysilicon layer within the low voltage region and the hard mask layer within the medium voltage region and the high voltage region can have top surfaces aligned. FIG. 7 illustrates some embodiments of a cross-sectional view 700 corresponding to act 1608.

At 1610, a hard mask is formed and patterned over the second polysilicon layer and the hard mask layer. In some embodiments, the hard mask can be formed by more than one dielectric layers, such as a composition of silicon dioxide and silicon nitride. FIG. 8 illustrates some embodiments of a cross-sectional view 800 corresponding to act 1610.

At 1612, the second polysilicon layer, the hard mask layer, the first polysilicon layer, the barrier layer, the second gate dielectric layer, and the first gate dielectric layer are patterned and etched to form a first gate stack within the low voltage region, a second gate stack within the medium voltage region, and a third gate stack within the high voltage region. FIG. 9 illustrates some embodiments of a cross-sectional view 900 corresponding to act 1612.

At 1614, a sidewall spacer is formed along sidewalls of the first gate stack, the second gate stack, and the third gate stack. A contact etch stop layer is formed lining sidewalls of the sidewall spacer. FIGS. 10-11 illustrate some embodiments of cross-sectional views 1000, 1100 corresponding to act 1614.

At 1616, a replacement gate process is subsequently performed by forming metal materials within the formed trenches. The second polysilicon layer and the first polysilicon layer are removed from the low voltage region, resulting in the formation of trenches between the sidewall spacers. Metal gate materials are then filled into the trenches to form a first gate electrode. FIG. 12 illustrates some embodiments of a cross-sectional view 1200 corresponding to act 1616.

At 1618, a second gate electrode is formed within the medium voltage region. A hard mask layer is formed and patterned to leave an opening at the medium voltage region. An etch is performed to expose the first polysilicon layer. A second portion of the third interlayer dielectric layer is also etched such that a top surface is aligned with the first polysilicon layer, and/or the sidewall spacer and the contact etch stop layer within the medium voltage region. The first polysilicon layer is processed to form the second gate electrode within the medium voltage region. FIG. 13 illustrates some embodiments of a cross-sectional view 1300 corresponding to act 1618.

At 1620, a third gate electrode is formed within the high voltage region. A portion of the hard mask layer within the high voltage region is removed. A masking layer is formed and patterned to cover the low voltage region and the medium voltage region. The high voltage region is exposed and subsequently etched to form a third portion of the third interlayer dielectric layer having a top surface aligned with the second gate dielectric layer, and/or the sidewall spacer and the contact etch stop layer within the high voltage region. A first interlayer dielectric layer is formed over the first gate electrode and the second electrode and the high-k dielectric layer extending across the low voltage region, the medium voltage region, and the high voltage region. A first metal layer is disposed over the first interlayer dielectric layer 116 and surrounded by a second interlayer dielectric layer. The first metal layer comprises a first metal line electrically coupled to the first gate electrode, a second metal line electrically coupled to the second gate electrode, and a third metal line disposed overlying the high-k dielectric layer. The third metal line is configured as the third gate electrode separating from the substrate by the first gate dielectric layer, the second gate dielectric layer, and the first interlayer dielectric layer. A first contacting via is formed to couple the first gate electrode and the first metal line. A second contacting via is formed to couple the second gate electrode and the second metal line. Other contacts or contacting vias can also be formed through the first interlayer dielectric layer and/or the third interlayer dielectric layer. FIGS. 14-15 illustrate some embodiments of cross-sectional views 1400, 1500 corresponding to act 1620.

Therefore, the present disclosure relates to an integrated circuit (IC) that a boundary structure of a low voltage region, a medium voltage region, and a high voltage region integrated in a substrate, and a method of formation and that provides small scale and high performance, and a method of formation.

In some embodiments, the present disclosure relates to an integrated circuit. The integrated circuit comprises a first transistor gate stack disposed in a low voltage region defined on a substrate. The first transistor gate stack comprises a first gate electrode and a first gate dielectric separating the first gate electrode from the substrate. The first gate dielectric comprises a first high-k dielectric component. The integrated circuit comprises a second transistor gate stack disposed in a medium voltage region defined on the substrate. The second transistor gate stack comprises a second gate electrode and a second gate dielectric separating the second gate electrode from the substrate. The second gate dielectric comprises a second high-k dielectric component and a first oxide component. The integrated circuit further comprises a third transistor gate stack disposed in a high voltage region defined on the substrate. The third transistor gate stack comprises a third gate electrode and a third gate dielectric separating the third gate electrode from the substrate. The third gate dielectric comprises a third high-k dielectric component, a second oxide component, and a first interlayer dielectric layer.

In other embodiments, the present disclosure relates to a method of forming an integrated circuit. The method comprises providing a substrate having a low voltage region, a medium voltage region, and a high voltage region defined on the substrate and forming and patterning an oxide layer on the substrate within the medium voltage region and the high voltage region. The method further comprises forming a high-k dielectric layer over the substrate within the low voltage region and over the oxide layer within the medium voltage region and the high voltage region and forming a first polysilicon layer over the high-k dielectric layer. The method further comprises forming and patterning a hard mask layer to cover the first polysilicon layer within the low voltage region and the medium voltage region and forming and patterning a second polysilicon layer directly on the first polysilicon layer within the low voltage region. The hard mask layer and the second polysilicon layer are formed having aligned top surfaces.

In yet other embodiments, the present disclosure relates to a method of forming an integrated circuit. The method comprises providing a substrate comprising a low voltage region, a medium voltage region and a high voltage region defined on the substrate and forming and patterning an oxide layer on the substrate within the medium voltage region and the high voltage region. The method further comprises forming a high-k dielectric layer over the substrate within the low voltage region and over the oxide layer within the medium voltage region and the high voltage region and forming a first polysilicon layer over the high-k dielectric layer. The method further comprises forming and patterning a second polysilicon layer directly on the first polysilicon layer within the low voltage region and forming and patterning a first hard mask over the first polysilicon layer within the low voltage region and a second hard mask over the first polysilicon layer within the medium voltage region. The method further comprises replacing the first polysilicon layer and the second polysilicon layer within the low voltage region by a metal material to form a first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a first transistor gate stack disposed in a low voltage region defined on a substrate, wherein the first transistor gate stack comprises a first gate electrode and a first gate dielectric separating the first gate electrode from the substrate, wherein the first gate dielectric comprises a first high-k dielectric component;
   a second transistor gate stack disposed in a medium voltage region defined on the substrate, wherein the second transistor gate stack comprises a second gate electrode and a second gate dielectric separating the second gate electrode from the substrate, wherein the second gate dielectric comprises a second high-k dielectric component and a first oxide component; and
   a third transistor gate stack disposed in a high voltage region defined on the substrate, wherein the third transistor gate stack comprises a third gate electrode and a third gate dielectric separating the third gate electrode from the substrate, wherein the third gate dielectric comprises a third high-k dielectric component, a second oxide component, and a first interlayer dielectric layer.

2. The IC of claim 1, wherein the first gate electrode is a metal gate electrode, and the second gate electrode comprises polysilicon.

3. The IC of claim 1, wherein the first interlayer dielectric layer extends across the low voltage region and the medium voltage region over the first gate electrode and the second gate electrode.

4. The IC of claim 1, wherein the third gate electrode is disposed within a second interlayer dielectric layer and overlying the first interlayer dielectric layer, wherein the first interlayer dielectric layer is a gate dielectric component that separates the third gate electrode from the substrate.

5. The IC of claim 4,
   wherein the first gate electrode is coupled to a first metal line of a first metal layer through a first contacting via;
   wherein the second gate electrode is coupled to a second metal line of the first metal layer through a second contacting via;
   wherein the third gate electrode is a third metal line of the first metal layer.

6. The IC of claim 5, wherein the first contacting via has a vertical height greater than that of the second contacting via.

7. The IC of claim 1, further comprising:
   a sidewall spacer disposed along sidewalls of the first transistor gate stack, the second transistor gate stack, and the third transistor gate stack; and
   a contact etch stop layer disposed over the substrate lining the sidewall spacer.

8. The IC of claim 7, further comprising:
   a hard mask disposed on the first gate electrode and contacting top surfaces of the sidewall spacer and the contact etch stop layer.

9. The IC of claim 1, wherein the first gate electrode has a first thickness greater than a second thickness of the second gate electrode.

10. The IC of claim 1, wherein the first high-k dielectric component, the first oxide component, and the second oxide component respectively contacts upper surfaces of the substrate.

11. The IC of claim 1,
    wherein the first, second and third high-k dielectric components have substantially the same composition and thickness;
    wherein the first and second oxide components have substantially the same composition and thickness.

12. The IC of claim 1, wherein the first interlayer dielectric layer comprises low-k dielectric material.

13. The IC of claim 1, wherein the first and second oxide components have top surfaces substantially aligned.

14. A method of forming an integrated circuit (IC), comprising:
    providing a substrate having a low voltage region, a medium voltage region, and a high voltage region defined on the substrate;
    forming and patterning an oxide layer on the substrate within the medium voltage region and the high voltage region;
    forming a high-k dielectric layer over the substrate within the low voltage region and over the oxide layer within the medium voltage region and the high voltage region;
    forming a first polysilicon layer over the high-k dielectric layer;
    forming and patterning a hard mask layer to cover the first polysilicon layer within the low voltage region and the medium voltage region; and forming and patterning a second polysilicon layer directly on the first polysilicon layer within the low voltage region;

wherein the hard mask layer and the second polysilicon layer are formed having aligned top surfaces.

15. The method of claim 14, further comprising:

patterning the second polysilicon layer, the hard mask layer, the first polysilicon layer, the high-k dielectric layer and the oxide layer; wherein a first gate stack is formed within the low voltage region comprising portions of the second polysilicon layer, the first polysilicon layer, and the high-k dielectric layer, wherein a second gate stack and the third gate stack are formed respectively within the medium voltage region and the high voltage region and each comprising portions of the hard mask layer, the first polysilicon layer, the high-k dielectric layer and the oxide layer;

replacing the portions of the second polysilicon layer and the first polysilicon layer of the first gate stack by a metal material, and removing the portion of the hard mask layer from the second gate stack such that the second gate stack is lower than the first gate stack.

16. The method of claim 15, further comprising:

removing the portion of the hard mask layer and the first polysilicon layer from the third gate stack such that the third gate stack is lower than the second gate stack.

17. The method of claim 16, further comprising:

forming a first interlayer dielectric layer over the third gate stack;

forming a first metal layer over the first interlayer dielectric layer;

wherein the first metal layer is formed having a metal line overlying the third gate stack within the high voltage region and configured as a third gate electrode separating from the substrate by the first interlayer dielectric layer and the third gate stack.

18. A method of forming an integrated circuit (IC), comprising:

providing a substrate having a low voltage region, a medium voltage region, and a high voltage region defined on the substrate;

forming and patterning an oxide layer on the substrate within the medium voltage region and the high voltage region;

forming a high-k dielectric layer over the substrate within the low voltage region and over the oxide layer within the medium voltage region and the high voltage region;

forming a first polysilicon layer over the high-k dielectric layer;

forming and patterning a second polysilicon layer directly on the first polysilicon layer within the low voltage region;

forming and patterning a first hard mask over the first polysilicon layer within the low voltage region and a second hard mask over the first polysilicon layer within the medium voltage region and replacing the first polysilicon layer and the second polysilicon layer within the low voltage region by a metal material to form a first gate electrode.

19. The method of claim 18, further comprising:

forming and patterning a first masking layer to cover the low voltage region and the high voltage region and to expose the first hard mask within the medium voltage region;

performing an etch to the first hard mask to expose the first polysilicon layer;

performing a silicidation process to the first polysilicon layer to form a second gate electrode.

20. The method of claim 19, further comprising:

forming and patterning a second masking layer to cover the low voltage region and the medium voltage region and to expose the second hard mask within the high voltage region;

performing an etch to the first hard mask to remove the second hard mask and the first polysilicon layer and to expose the high-k dielectric layer within the high voltage region;

forming a first interlayer dielectric layer over the first gate electrode, the second gate electrode, and the high-k dielectric layer;

forming a first metal layer over the first interlayer dielectric layer and surrounded by a second interlayer dielectric layer;

wherein the first metal layer is formed including a first metal line electrically coupled to the first gate electrode, a second metal line electrically coupled to the second gate electrode, and a third metal line disposed directly above the high-k dielectric layer within the high voltage region and configured as a third gate electrode separating from the substrate by the first interlayer dielectric layer, the high-k dielectric layer, and the oxide layer.

* * * * *